United States Patent
Pal et al.

(10) Patent No.: US 11,025,207 B2
(45) Date of Patent: Jun. 1, 2021

(54) BIAS TECHNIQUES FOR CONTROLLED VOLTAGE DISTRIBUTION IN STACKED TRANSISTOR AMPLIFIERS

(71) Applicant: pSemi Corporation, San Diego, CA (US)

(72) Inventors: Kashish Pal, Reading (GB); John Birkbeck, New Milton (GB)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 16/563,481

(22) Filed: Sep. 6, 2019

(65) Prior Publication Data

US 2021/0075377 A1    Mar. 11, 2021

(51) Int. Cl.
| H03F 3/19 | (2006.01) |
| H03F 3/193 | (2006.01) |
| H03F 1/02 | (2006.01) |
| H04B 1/04 | (2006.01) |

(52) U.S. Cl.
CPC .......... *H03F 3/193* (2013.01); *H03F 1/0205* (2013.01); *H03F 2200/451* (2013.01); *H04B 1/04* (2013.01)

(58) Field of Classification Search
CPC ...................................................... H03F 3/193
See application file for complete search history.

(56) References Cited

U.S. PATENT DOCUMENTS

| 8,497,736 B1 | 7/2013 | Leipold et al. |
| 10,250,199 B2 | 4/2019 | Klaren et al. |
| 2014/0043102 A1* | 2/2014 | Su ............................ H03F 3/193 330/295 |
| 2014/0266458 A1* | 9/2014 | Scott ...................... H01F 27/385 330/291 |
| 2018/0262164 A1* | 9/2018 | Ranta ...................... H03F 3/213 |
| 2020/0036341 A1* | 1/2020 | Klaren .................. H03F 1/0266 |

OTHER PUBLICATIONS

Non-Final Office Action for U.S. Appl. No. 16/563,408 dated Jan. 21, 2021, 9 pages.

* cited by examiner

*Primary Examiner* — Paticia T Nguyen
(74) *Attorney, Agent, or Firm* — Steinfl + Bruno LLP

(57) ABSTRACT

Various methods and circuital arrangements for biasing gates of stacked transistors of a cascode amplifier are presented, where the amplifier is configured to operate according to different modes of operation. Such circuital arrangements operate in a closed loop with a feedback voltage that is based on a sensed voltage at one or more nodes of a replica circuit of the stacked transistors, the amplifier and the replica circuit biased with same gate voltages. According to one aspect, one gate voltage is adjusted based on a comparison of the feedback voltage with a reference voltage, and other gate voltages are derived by offsetting of the one gate voltage with voltages generated by a current flow through a resistive ladder network.

30 Claims, 11 Drawing Sheets

BIAS TECHNIQUES FOR CONTROLLED VOLTAGE DISTRIBUTION IN STACKED TRANSISTOR AMPLIFIERS

CROSS REFERENCE TO RELATED APPLICATIONS

The present application is related to U.S. application Ser. No. 16/563,408 entitled "Bias Circuit for Mixed Polarity Transistor Stacks" filed on even date herewith, the disclosure of which is incorporated herein by reference in its entirety. The present application is also related to U.S. Pat. No. 10,250,199 B2 entitled "Cascode Amplifier Bias Circuits" issued Apr. 2, 2019, the disclosure of which is incorporated herein by reference in its entirety.

TECHNICAL FIELD

The present application relates to amplifiers. In particular, the present application relates to gate biasing for amplifiers comprising stacked transistors which can operate according to different modes of operation under different biasing conditions.

BACKGROUND

In recent years, stacked cascode amplifiers, which use a plurality of transistors arranged as a stack (stacked transistors) in an amplification stage of the amplifiers, have become predominant in radio frequency (RF) applications where high power, high voltage outputs are desired, for example, in transmitter sections of RF front-end communication systems. Due to the higher number of transistors in the stack, voltage handling performance of the amplifier is increased, thereby allowing the high power, high voltage outputs. Since the stacked transistors comprise individual low voltage transistors which can tolerate a voltage substantially lower than the output voltage of the amplifier, it is important to bias the low voltage transistors of the stack to maintain operation within their tolerable voltage ranges. In cases where the amplifier can operate according to different modes of operation, such voltage compliance of the low voltage transistors of the stack must be maintained not only during each of the modes of operation but also during a transition from one mode of operation to another. This becomes a challenge in cases wherein the input transistor of the stack is biased using a circuit (i.e., a circuital arrangement) that is independent from a circuit used to bias the (upper) cascode transistors of the stack, as such independent circuits may each respond differently under transient conditions and therefore potentially generate, in combination, unsafe biasing conditions for one or more of the transistors of the stack. Other drawbacks of using such independent circuits may also include different PVT (process, voltage and temperature variations) characteristics of components of the circuits which again, in combination, can generate the unsafe biasing conditions. With the advent of newer semiconductor process technologies, such as for example 45 nm process and beyond, resultant smaller (e.g., size, width) transistors having reduced voltage handling ranges may require a tighter control of their biasing conditions when used in stacked amplifiers. Teachings according to the present disclosure address such challenges.

SUMMARY

The various teachings according to the present disclosure describe biasing techniques and circuits for providing biasing voltages of the stacked transistors of a radio frequency (RF) amplifier in a controlled manner to maintain voltage compliance of each of the stacked transistors for safe operation during the various modes of operation of the amplifier as well as during transient conditions that may be associated to operation in-between modes of operation.

According to a first aspect of the present disclosure, a circuital arrangement is presented, the circuital arrangement comprising: a main stack configured to operate as an amplifier, the transistor stack comprising a plurality of stacked transistors comprising an input transistor and one or more cascode transistors comprising a cascode output transistor; the transistor stack configured to operate between a first supply voltage coupled to the output transistor and a reference ground coupled to the input transistor; a replica stack of the main stack comprising a plurality of stacked transistors, the replica stack configured to operate between the first supply voltage coupled to a cascode output transistor of the replica stack and the reference ground coupled to an input transistor of the replica stack, wherein gates of the plurality of stacked transistors of the replica stack are coupled to respective gates of the plurality of stacked transistors of the main stack; and a gate biasing circuit coupled to the gates of the plurality of stacked transistors of the replica stack to provide respective gate biasing voltages to the replica stack and the main stack, the gate biasing circuit further coupled to a sensing node of the plurality of stacked transistors of the replica stack, wherein the gate biasing circuit comprises a feedback loop that is configured to use a sensed voltage at the sensing node as a feedback voltage to adjust one gate biasing voltage provided to a gate of a transistor of the plurality of stacked transistors of the replica stack and the main stack, and wherein the gate biasing circuit is configured to generate gate biasing voltages for remaining transistors of the plurality of stacked transistors of the replica stack and the main stack by offsetting the one gate biasing voltage with respective fixed offset voltages.

According to a second aspect of the present disclosure, a method for biasing a transistor stack is presented, the method comprising: providing a main stack comprising a plurality of stacked transistors for operation as an amplifier; providing a replica stack of the main stack; coupling gates of the main stack to gates of the replica stack; sensing a voltage at a sensing node of the replica stack; based on the sensing, using a sensed voltage in a closed loop circuit to adjust one gate biasing voltage of one transistor of the replica stack and the main stack; and based on adjusting of the one gate voltage, generating gate voltages to remaining transistors of the replica stack and the main stack by offsetting the one gate biasing voltage with respective fixed offset voltages.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 1A:
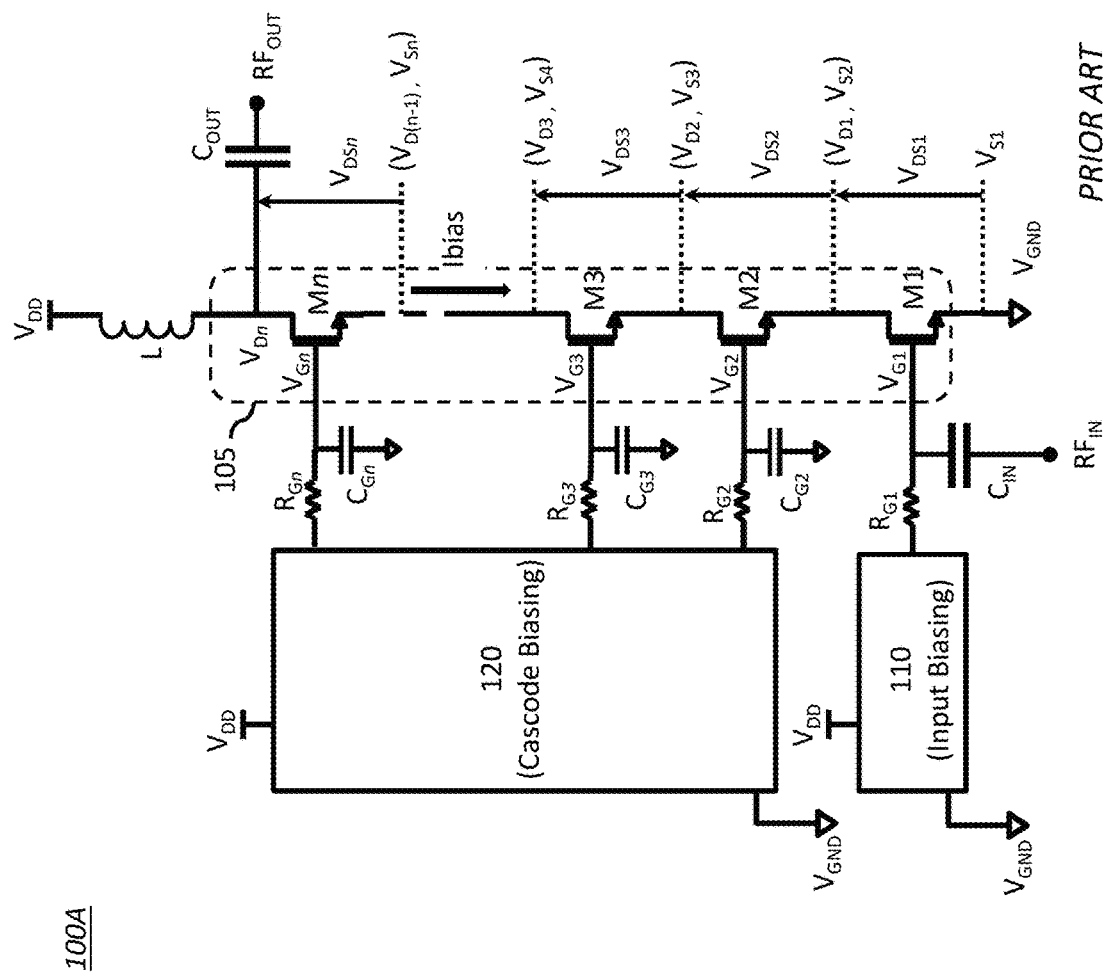
FIG. 1A shows a prior art configuration of a stacked transistor amplifier, wherein different and independent biasing circuits are used to bias each of the input transistor and the cascode transistors of the stack.

FIG. 1A shows a simplified schematic of a prior art stacked cascode (RF) amplifier (105) that is DC biased by two independent biasing circuits, including an input biasing circuit (110) for providing a gate biasing voltage, $V_{G1}$, of an input transistor M1 of the amplifier (105), and a cascode biasing circuit (120) for providing gate biasing voltages $(V_{G2}, \ldots, V_{Gn})$ of cascode transistors (M2, ..., Mn) of the amplifier (105).

The stacked cascode amplifier (105) shown in FIG. 1A can comprise a stack of FET transistors (M1, M2, ..., Mn) that include an input transistor M1 and cascode transistors (M2, ..., Mn), including cascode output transistor Mn. An input RF signal, $RF_{IN}$, is coupled to a gate $V_{G1}$ of the input transistor, M1, and is amplified by the amplifier (105). A corresponding amplified output RF signal, $RF_{OUT}$, is output at a drain of the output transistor Mn. Bypass capacitors ($C_{IN}$, $C_{OUT}$) can be used to decouple low frequency (e.g., DC) biasing voltages provided to the stack of transistors (transistor stack) from the $RF_{IN}$ and $RF_{OUT}$ signals. A supply voltage $V_{DD}$ is coupled to the drain of the output transistor Mn through an inductor L, and a reference ground $V_{GND}$ (e.g., GND or AC ground) is coupled to a source of the input transistor M1. A number n of the stacked transistors may be any integer number larger than or equal to two, and may be a function of a level of the supply voltage and tolerable voltage (e.g., handling voltage) ranges of the transistors (M1, M2, ..., Mn).

With continued reference to FIG. 1A, gate capacitors $(C_{G2}, \ldots, C_{GN})$ coupled between respective gates of the cascode transistors (M2, ..., Mn) and the reference ground $V_{GND}$ may be used to further protect the transistors of the stack from added stress caused by RF voltage components during amplification of an RF signal. Accordingly, the value of each of the gate capacitors $(C_{G2}, \ldots, C_{GN})$ may be chosen to allow each of the gate voltages $(V_{G2}, \ldots, V_{GN})$ to vary along (float) with the RF signal at a drain of a respective cascode transistor (M2, ..., Mn), which consequently allows control of a voltage drop (e.g., $V_{DS}$) across the transistor. In addition, series gate resistors ($R_{G1}$, $R_{G2}$, ..., $R_{Gn}$) may be used to decouple an RF signal at the gates of the transistors (M1, M2, ..., Mn) from the biasing circuits (110) and (120), and therefore ensure that the RF signal has a reduced effect on the biasing circuit.

With further reference to FIG. 1A, the gate biasing voltages $(V_{G2}, V_{G3}, \ldots, V_{Gn})$ generated by the cascode biasing circuit (120) are such that each transistor (M1, M2, ..., Mn) of the stack is (DC) biased according to a voltage compliance of the transistor. In other words, a voltage across any two terminals (e.g., gate, source, drain) of the transistor is within a safe operating range of the transistor. As clearly understood by a person skilled in the art, the gate biasing voltages $(V_{G2}, V_{G3}, \ldots, V_{Gn})$ generated by the cascode biasing circuit (120) distribute the supply voltage $V_{DD}$, which is coupled to the drain of the output transistor Mn through the inductor L, across the drain-to-source voltages $(V_{DS1}, V_{DS2}, \ldots, V_{DSn})$ of the transistors (M1, M2, ..., Mn). Such distribution of the supply voltage may be in view of a flow of a bias current, Ibias, through the transistor stack that is established via the gate biasing voltage $V_{G1}$ to the input transistor M1 generated by the input biasing circuit (110). For example, a desired value of the (DC) current Ibias that corresponds to a desired gain of the amplifier (105) and a desired distribution (e.g., division) of the supply voltage $V_{DD}$ across the drain-to-source voltages $(V_{DS1}, V_{DS2}, \ldots, V_{DSn})$ of the transistors (M1, M2, ..., Mn) may first be established, followed by generating via the input biasing circuit (110) the gate biasing voltage $V_{G1}$ that provides the current Ibias, and generating via the cascode biasing circuit (120) the gate biasing voltages $(V_{G2}, V_{G3}, \ldots, V_{Gn})$ that respectively control the drain voltages $(V_{D1}, V_{D2}, \ldots, V_{D(n-1)})$ such as to obtain the desired distribution of the supply voltage $V_{DD}$. It should be noted that as used herein, the expressions "distribute the supply voltage across the transistors", "distribute the supply voltage across the stack", and "distribute the supply voltage across the drain-to-source voltages of the transistors" are equivalent, wherein the distribution can be an equal distribution (i.e., even distribution) or an unequal distribution (i.e., uneven distribution).

With continued reference to FIG. 1A, a change (e.g., fluctuation) in a value of the gate biasing voltage $V_{G1}$ while maintaining the gate biasing voltages $(V_{G2}, V_{G3}, \ldots, V_{Gn})$ fixed, can affect the biasing current Ibias that flows through each transistor (M1, M2, ..., Mn), which in turn can affect one or more of the gate-to-source voltages (i.e., $V_{Gn}$-$V_{Sn}$, not shown in the figure for clarity purposes) of the cascode transistors (M2, . . . , Mn), which in turn can affect one or more of the drain voltages ($V_{D1}$, $V_{D2}$, . . . , $V_{D(n-1)}$), and which can therefore affect one or more of the drain-to-source voltages ($V_{DS1}$, $V_{DS2}$, . . . , $V_{DSn}$). Similarly, a change (e.g., fluctuation) in a value of any one of the gate biasing voltages ($V_{G2}$, $V_{G3}$, . . . , $V_{Gn}$) while maintaining the gate biasing voltage $V_{G1}$ fixed, can ripple through the chain of voltages along the stack of transistors and affect any one or more of the drain-to-source voltages ($V_{DS1}$, $V_{DS2}$, . . . , $V_{DSn}$) and the gate-to-source voltages of the cascode transistors (M2, . . . , Mn). A person skilled in the art will understand that given large enough (relative) changes of the gate biasing voltage $V_{G1}$ with respect to one or more of the gate biasing voltages ($V_{G2}$, $V_{G3}$, . . . , $V_{Gn}$), voltage compliance of one or more of the transistors (M1, M2, . . . , Mn) may be violated.

Figure 1B:
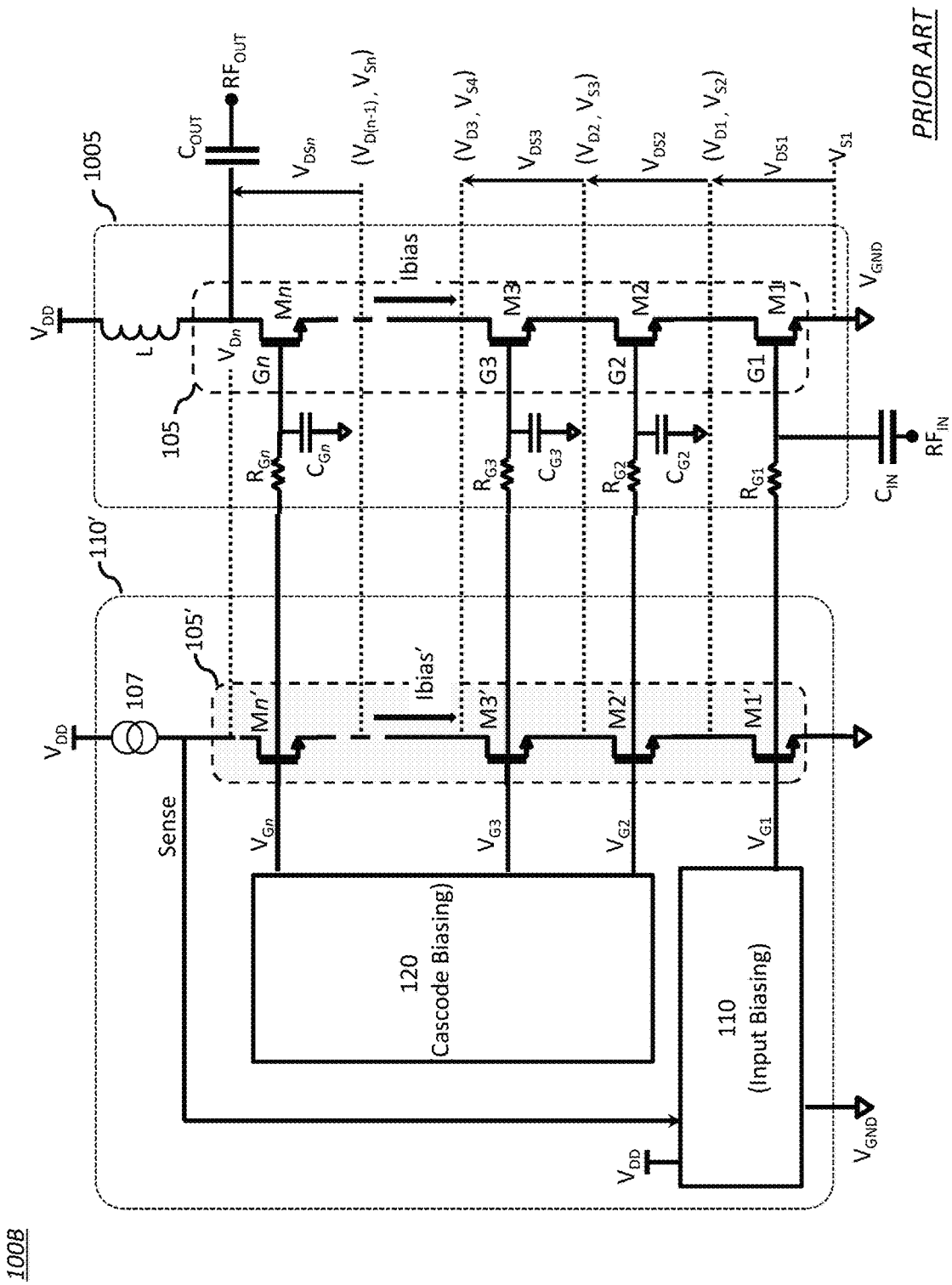
FIG. 1B shows a prior art configuration of a stacked transistor amplifier, wherein a replica circuit of the stacked transistor amplifier is used in a biasing circuit to bias the input transistor and the cascode transistors of the stacked transistor amplifier.

Some prior art configurations, for example as described in the above referenced U.S. Pat. No. 10,250,199 B2, may use a replica circuit (also referred to herein as "replica stack") of the stacked cascode amplifier (also referred herein as the "main stack") in a biasing circuit to mirror a bias current through the amplifier as shown in FIG. 1B. As shown in FIG. 1B, gates of the transistors (M1', . . . , Mn') of the replica circuit (105') are coupled to respective gates of the transistors (M1, . . . , Mn) of the stacked amplifier (105) so that the replica circuit (105') and the stacked amplifier (105) are biased with same gate biasing voltages. Furthermore, as can be seen in FIG. 1B, the replica circuit (105') and the stacked amplifier (105) operate from the same supply voltage $V_{DD}$ with respect to a same reference ground $V_{GND}$. Therefore, i) the replica circuit (105') and the stacked amplifier (105) provide a near identical distribution of the supply voltage $V_{DD}$ across respective transistors (M1', . . . , Mn') and (M1, . . . , Mn); and ii) transistors (M1', . . . , Mn') of the replica circuit (105') have near identical operating points (i.e., biasing conditions) as respective transistors (M1, . . . , Mn) of the stacked amplifier (105). It should be noted that in a practical implementation, the transistors Mn and Mn' at the top of the stack may have slightly different operating points to each other depending on the voltage drop across the current source (107) but this has negligible effect on the operation of the circuit. In other words, it is possible that the drain voltage (annotated $V_{Dn}$ in the figures) of the output transistors Mn and Mn' may be (slightly) different due to the voltage drop across the current source (107) assuming that, as shown in FIG. 1B, the current source (107) operates from the same supply voltage $V_{DD}$ as the stacked amplifier (105). If present, this effect can be overcome by either compensating the supply voltage to the replica circuit (105') for the drop across the current source (107) (e.g. supply voltage to the replica circuit is based on $V_{DD}$ with an added offset voltage corresponding to the voltage drop across the current source (107)), or using a configuration according to the present disclosure as later described with reference to FIG. 3D.

With continue reference to FIG. 1B, as understood by a person skilled in the art, a bias current, Ibias, through the stacked amplifier (105) is a multiple of a bias current, Ibias', through the replica circuit (105'), wherein a ratio of the two currents Ibias/Ibias' is equal to a ratio of a size of the stacked transistor (105) to a size of the replica circuit (105'). As used herein, a replica circuit (e.g., 105' of FIG. 1B) of a reference stacked cascode amplifier (e.g., 105 of FIG. 1B) is referred to a stacked cascode amplifier which is a fraction of the size as the reference stacked cascode amplifier, wherein the transistors of the replica circuit (e.g., M1', . . . , Mn' of FIG. 1B) are of same characteristics (e.g., I-V curve and PVT) as transistors of the reference stacked cascode amplifier (e.g., M1, . . . , Mn of FIG. 1B), but reduced in size. Accordingly, the replica circuit is a "reduced size" replica circuit of the reference stacked cascode amplifier. Ratio in size between the replica circuit and the reference stacked cascode transistor may be considered as a design choice and can depend on an assigned power consumption budget of the replica circuit. A typical ratio can be in a range of 1:20 to 1:100 or smaller. Furthermore, it should be noted that the replica circuit (105') may include a number of stacked transistors that is not necessarily equal to a number of stacked transistors of the stacked amplifier (105). In other words, a stack height of the replica circuit (105') may be different from a stack height of the stacked amplifier (105). Accordingly, as used herein, the replica circuit (e.g., 105') is a circuit that can "replicate" one or more performance characteristics of a main circuit (e.g., 105). In the case of the present application, applying same one or more gate biasing voltages to the replica circuit and the main circuit may cause a bias current flow through the main circuit that is proportional to a bias current that flow through the replica circuit, proportionality being based on a ratio in size between the main circuit and the replica circuit. As shown in FIG. 3D later described, teachings according to the present disclosure equally apply to replica circuits (e.g., 105' of FIG. 3D) having stack heights different from the main circuit (e.g., 105 of FIG. 3D).

In the prior art configuration shown in FIG. 1B, a current source (107) may be used to provide a bias current, Ibias', through the replica circuit (105') that corresponds to a ratio of a desired bias current, Ibias, through the stacked cascode amplifier (105). The (Input) biasing circuit (110) and the (Cascode) biasing circuit (120) may in turn generate the gate biasing voltages ($V_{G1}$, . . . , $V_{Gn}$) to the replica circuit (105') to provide flow of the bias current, Ibias'. Accordingly, since same gate biasing voltages ($V_{G1}$, . . . , $V_{Gn}$) are provided to the gates of the stacked cascode amplifier (105), the current Ibias flows through the amplifier (105).

In the prior art configuration shown in FIG. 1B, the biasing circuit (110) generates the gate biasing voltage $V_{G1}$ to the gate of the input transistor M1' based on a voltage/current sensed (denoted Sense in FIG. 1B) at the drain of the top transistor Mn' of the replica stack (105'). In some cases, as explained for example in the above referenced U.S. Pat. No. 10,250,199 B2, the sensed voltage/current at the drain of the top transistor Mn' can be used as an input to a closed loop circuit implemented with the biasing circuit (110) for generation and adjustment of the gate biasing voltage $V_{G1}$. However, since gate biasing voltages ($V_{G2}$, . . . , $V_{Gn}$) to the cascode transistors (M2', . . . , Mn'), and therefore to the cascode transistors (M2, . . . , Mn), do not (precisely) follow the adjustment of $V_{G1}$, same issues with respect to violation of the voltage compliance of one or more of the transistors (M1, M2, . . . , Mn) of the stacked cascode amplifier (105) as described above with reference to FIG. 1A can be observed in the prior art configuration of FIG. 1B. The configuration shown in FIG. 1B can be partitioned according to a DC biasing circuit comprising elements (110, 120, 105', 107) and an RF amplifier circuit (1005) comprising the stacked cascode amplifier (105) coupled to series gate resistors ($R_{G1}$, $R_{G2}$, . . . , $R_{Gn}$) and gate capacitors ($C_{G2}$, . . . , $C_{GN}$) as described above.

A person skilled in the art readily knows that the amplifier (105) shown in FIG. 1A and FIG. 1B may operate according to different modes of operations that may require different gate biasing voltages. Such different modes of operation may include modes associated to, for example, different amplification gains, or simply an active mode wherein an RF signal is amplified and a standby mode (e.g., inactive mode) wherein no amplification occurs and currents through the stack (i.e., Ibias) and other related circuits may be minimized for energy saving purposes. Response of the two (independent) biasing circuits (110) and (120) to a mode change request (e.g., via one or more control signals not shown in the figure) may include a transient mode wherein output (gate biasing) voltages fluctuate according to different responses of the biasing circuits before stabilizing to the target/proper values. As the biasing circuits (110) and (120) are independent, no known/fixed relationship between the different responses, and therefore between voltages during the transient mode, may exist. Therefore, during the transient mode, the gate biasing voltage $V_{G1}$ and gate biasing voltages ($V_{G2}$, $V_{G3}$, ..., $V_{Gn}$) may not track one another in a controlled manner. In turn, this can result in relative changes between the gate voltages $V_{G1}$ and ($V_{G2}$, $V_{G3}$, ..., $V_{Gn}$) that as described above may be large enough to result in non-compliance of the voltages such that one or more of the transistors (M1, M2, ..., Mn) may not operate within their tolerable voltage ranges. In turn, one or more of the transistors (M1, M2, ... Mn) may fail causing malfunction of the stacked cascode amplifier (105).

Figure 2A:
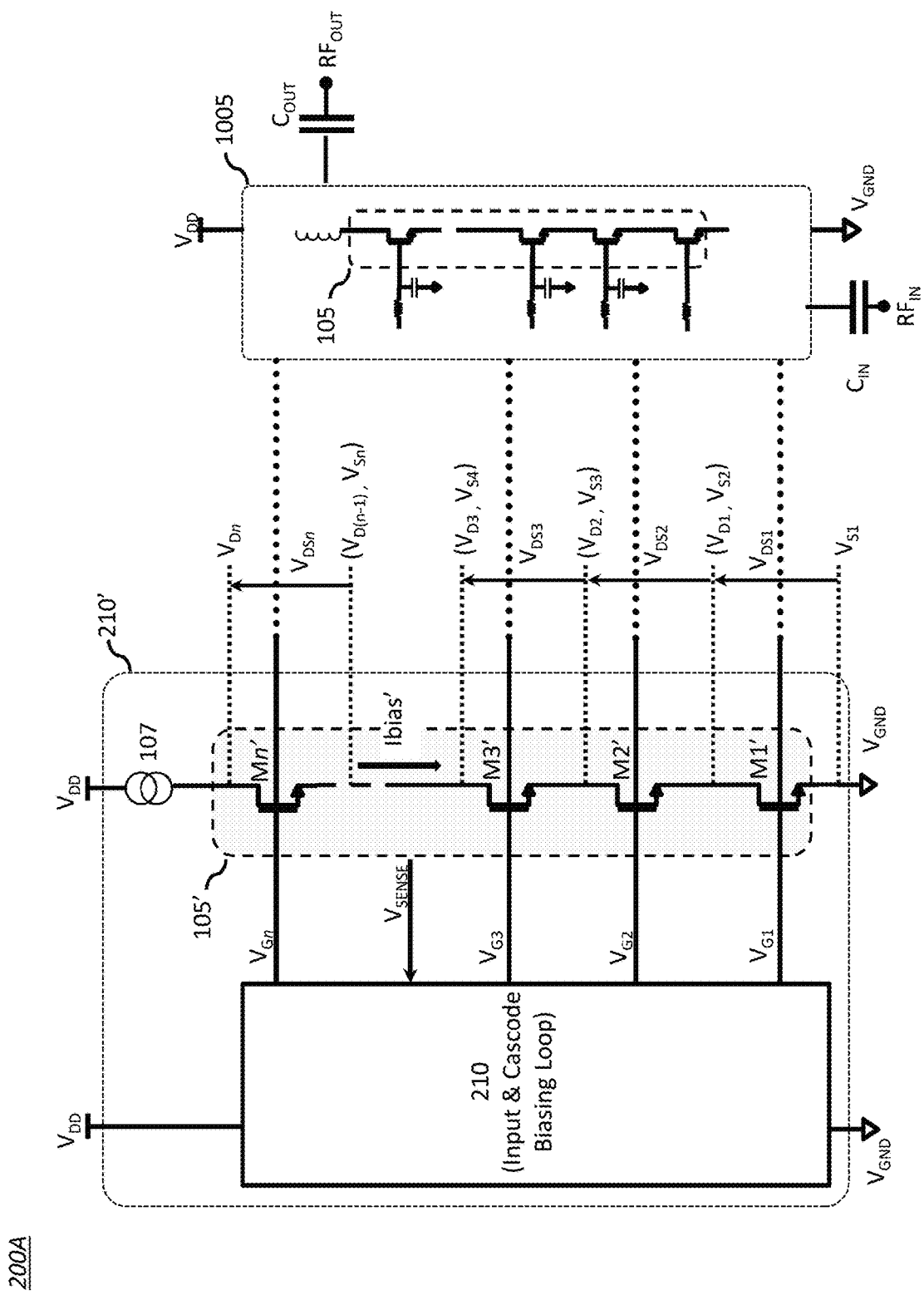
FIG. 2A shows an embodiment according to the present disclosure of a stacked transistor amplifier, wherein biasing of the input transistor and the cascode transistors is provided via a same biasing circuit that operates in a closed loop based on a voltage that is sensed from a replica circuit of the stacked transistor amplifier.

FIG. 2A shows an embodiment according to the present disclosure wherein generation of the gate biasing voltages $V_{G1}$ and ($V_{G2}$, ..., $V_{Gn}$) is provided via a same biasing circuit (210) that is coupled to the replica circuit (105') described above. According to an embodiment of the present disclosure, biasing of the input transistor (M1') and the cascode transistors (M2', ..., ..., Mn') of the replica circuit (105') is provided via the biasing circuit (210) that operates in a closed loop based on a (feedback) voltage Vsense that is sensed from the replica circuit (105'). In the embodiment shown in FIG. 2A, the biasing circuit (210) uses the Vsense voltage to detect a change in a biasing condition of the stacked transistors (M1', M2', ..., Mn') and control the gate voltages ($V_{G1}$, $V_{G2}$, ..., $V_{Gn}$), which as described above are also provided to the gate nodes (G1, ..., Gn per FIG. 1B, not shown in FIG. 2A and subsequent figures for clarity purposes) of the stacked cascode amplifier (105) included in the RF amplifier circuit (1005), accordingly. Such change in the biasing condition may be responsive to a controlled change in operating mode of the amplifier (1005) or to a change/variation of components of the amplifier (1005) in view of their respective PVT characteristics.

With continued reference to FIG. 2A, the biasing circuit (210) may use the voltage Vsense to adjust the gate biasing voltages ($V_{G1}$, $V_{G2}$, ..., $V_{Gn}$) in a controlled manner so to maintain operation of each of the transistors (M1', M2', ..., Mn') of the replica circuit (105'), and therefore of each of the transistors (M1, M2, ..., Mn) of the RF amplifier (1005), within their respective tolerable voltage ranges during any detected change of the voltage Vsense. According to an exemplary embodiment of the present disclosure, the biasing circuit (210) may use the voltage Vsense to adjust the gate biasing voltages ($V_{G1}$, $V_{G2}$, ..., $V_{Gn}$) so to maintain a substantially same distribution of the supply voltage $V_{DD}$ across the stacked transistors (M1', M2', ..., Mn-1') and (M1, M2, ..., Mn). In other words, drain-to-source voltages ($V_{DS1}$, $V_{DS2}$, ..., $V_{DS(n-1)}$) of the transistors (M1', M2', ..., Mn-1') may be maintained to be substantially same in spite of a change in the biasing condition of the stacked transistors (M1', M2', ..., Mn') as reflected by the Vsense voltage fed back to the biasing circuit (210). It should be noted that such distribution of the supply voltage may not necessarily be an equal distribution (i.e., division), and therefore one may arbitrarily choose the voltage distribution and thus the operating points of the transistors used in the replica circuit (105') and therefore of the transistors used in the RF amplifier (1005).

According to an embodiment of the present disclosure, the biasing circuit (210) may use the voltage Vsense to adjust one of the gate biasing voltages ($V_{G1}$, $V_{G2}$, ..., $V_{Gn}$) and derive the other gate biasing voltages by adding and/or removing fixed offset voltages to/from the one adjusted gate biasing voltage. Such fixed offset voltages may be based on a desired distribution of the supply voltage $V_{DD}$ across the drain-to-source voltages ($V_{DS1}$, $V_{DS2}$, ..., $V_{DSn}$). For example, a person skilled in the art will understand that if same type and size transistors are used in the replica circuit (105'), and therefore in the RF amplifier (1005), shown in FIG. 2A, then such transistors may operate according to a same gate-to-source ($V_{GS}$) voltage and therefore the fixed offset voltages, may be easily derived from values of ($V_{DS1}$, $V_{DS2}$, ..., $V_{DSn}$) specified by the desired distribution of the supply voltage $V_{DD}$. According to an exemplary embodiment of the present disclosure, and as later described with reference to FIGS. 3A-3C, the one adjusted gate biasing voltage may be $V_{G1}$.

With further reference to FIG. 2A, according to a further embodiment of the present disclosure, the gate biasing voltages ($V_{G1}$, $V_{G2}$, ..., $V_{Gn}$) may scale with respect to a changing/varying supply voltage $V_{DD}$ so to ratiometrically control the drain-to-source voltages ($V_{DS1}$, $V_{DS2}$, ..., $V_{DS(n-1)}$) of the transistors (M1', M2', ..., Mn-1') and therefore (M1, M2, ..., Mn). Accordingly, for a given value of the supply voltage $V_{DD}$, the biasing circuit (210) may use the voltage Vsense to adjust the gate biasing voltages ($V_{G1}$, $V_{G2}$, ..., $V_{Gn}$) so to maintain a substantially same distribution of the supply voltage $V_{DD}$ across the stacked transistors (M1', M2', ..., Mn-1') and therefore (M1, M2, ..., Mn).

Such scaling of gate biasing voltages ($V_{G1}$, $V_{G2}$, ..., $V_{Gn}$) by the biasing circuit (210) with respect to a changing/varying supply voltage $V_{DD}$ may be provided by designing the biasing circuit (210) to operate from the supply voltage $V_{DD}$ as shown in FIG. 2A. For example, if the biasing circuit (210) uses reference voltages and/or currents to generate the gate biasing voltages ($V_{G1}$, $V_{G2}$, ..., $V_{Gn}$), according to an embodiment of the present disclosure, such reference voltages and/or currents may be designed to scale with respect to the supply voltage $V_{DD}$. In other words, a percentage change of the supply voltage $V_{DD}$ may engender a same percentage change in the reference voltages and/or currents. It should be noted that, as understood by a person skilled in the art, the biasing circuit (210) may be designed to have a response in time (e.g., settling time of output voltages) that is faster than an expected change in time of the supply voltage $V_{DD}$. In other words, the biasing circuit (210) may control the gate biasing voltages ($V_{G1}$, $V_{G2}$, ..., $V_{Gn}$) at a rate that is larger than a rate of change of the supply voltage $V_{DD}$ so to allow the gate biasing voltages ($V_{G1}$, $V_{G2}$, ..., $V_{Gn}$) to track such changes. A person skilled in the art is well aware of feedback loop design techniques that can be used in the (closed loop) biasing circuit (210) to provide loop gains to satisfy such requirements.

Figure 2B:
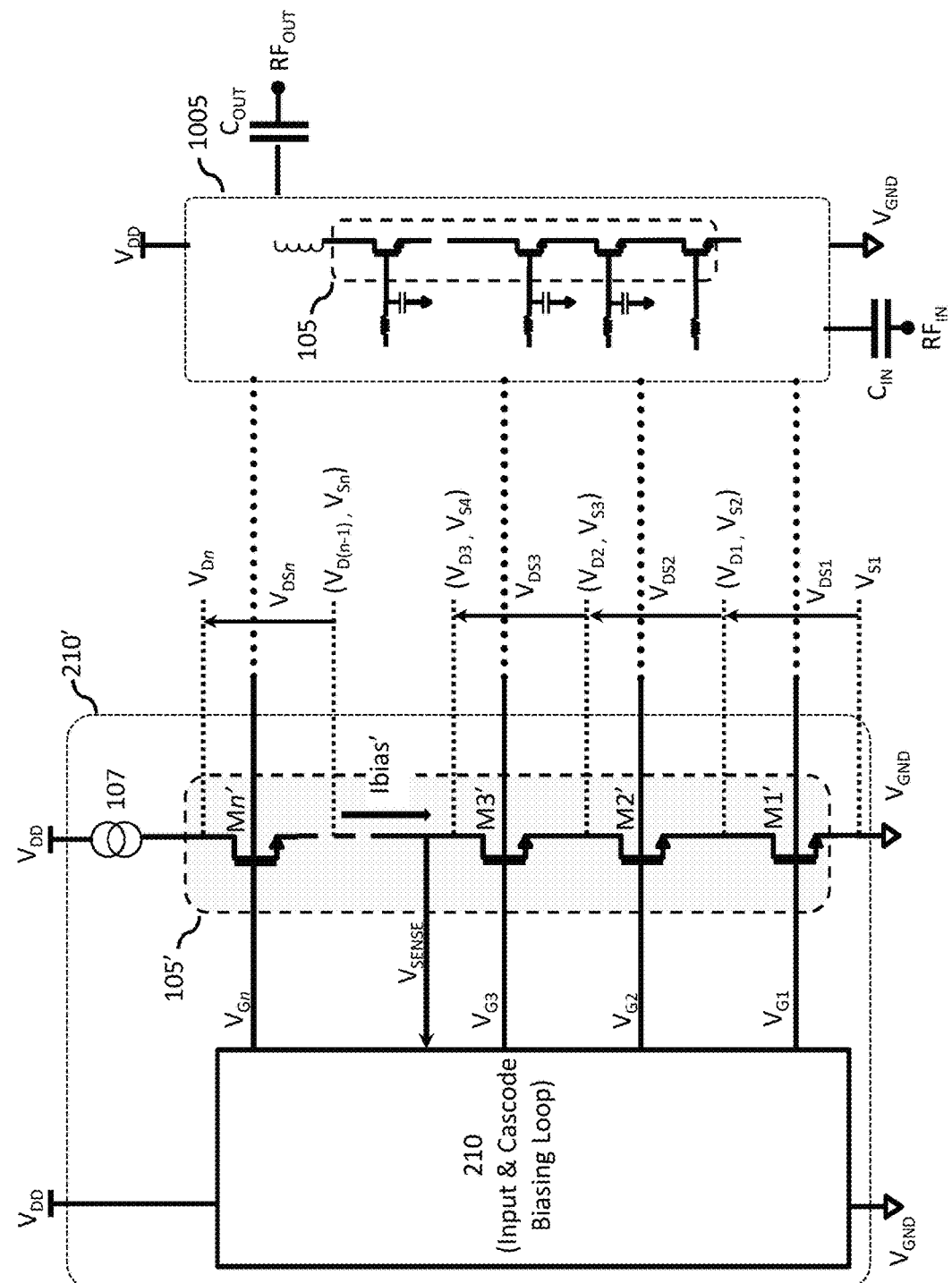
FIG. 2B shows an exemplary embodiment according to the present disclosure of the stacked transistor amplifier of FIG. 2A, wherein the closed loop is based on a voltage that is sensed at a drain node high in the stack of the cascode transistor of the replica circuit.
Figure 2C:
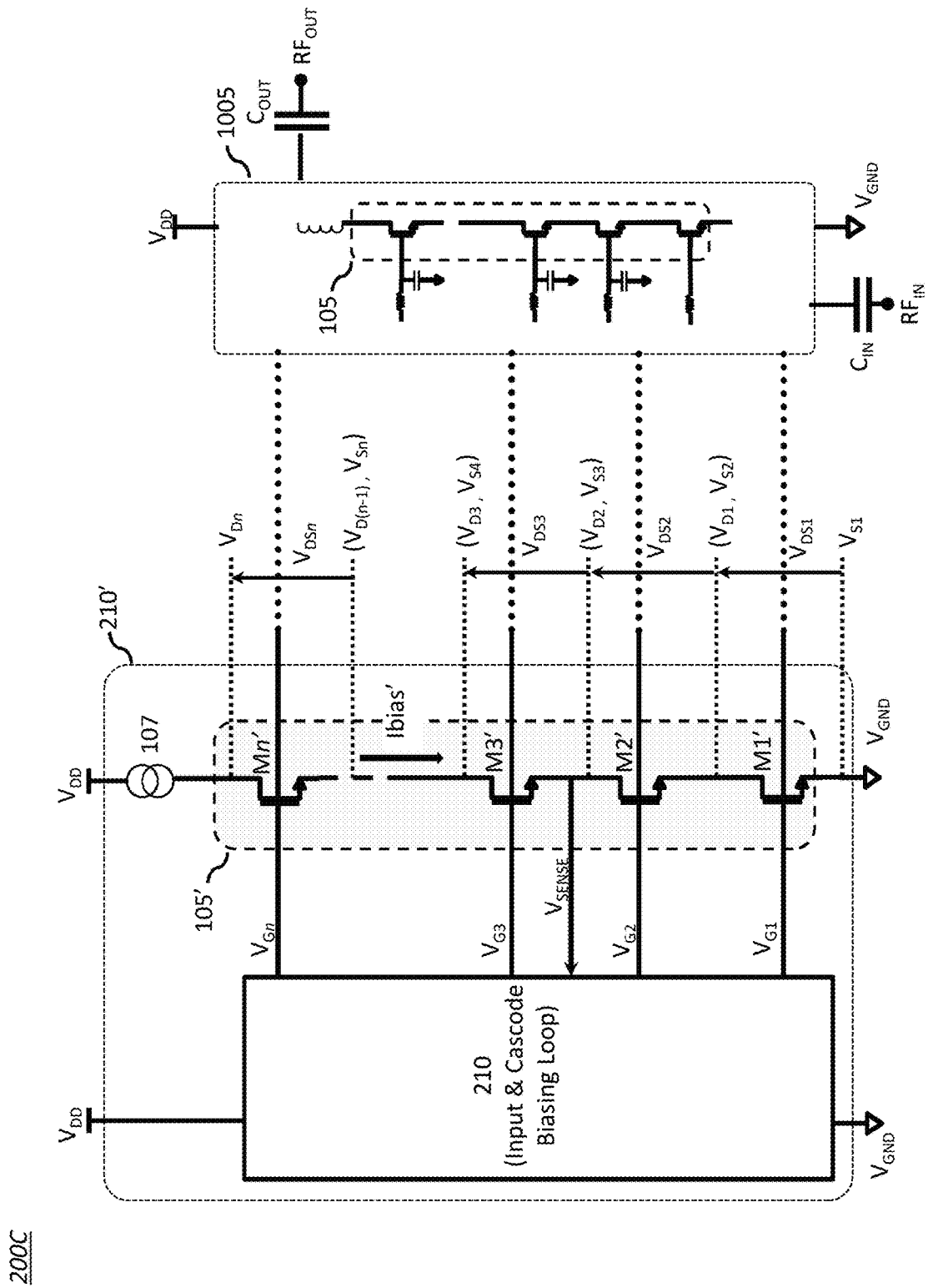
FIG. 2C shows an exemplary embodiment according to the present disclosure of the stacked transistor amplifier of FIG. 2A, wherein the closed loop is based on a voltage that is sensed at a drain node of a cascode transistor at a lower position in the replica circuit.

According to an embodiment of the present disclosure, the Vsense voltage may be coupled to any node of the replica circuit (105') that may represent a change in a biasing condition of the transistors (M1', M2', ... Mn'). According to an exemplary embodiment of the present disclosure shown in FIG. 2B, closed loop operation of the biasing circuit (210) may be based on a voltage Vsense that is sensed at (i.e., coupled to) a drain node of a cascode transistor (e.g., M3') of the replica circuit (M1', M2', . . . , Mn'). In the exemplary non-limiting embodiment depicted in FIG. 2B, the Vsense voltage is shown as sensed at the drain node of M3' and therefore taking the value of the drain voltage $V_{D3}$. Since the stacked transistors (M1', M2', . . . , Mn') of the replica circuit (105') are in series connection via common source-drain nodes of two consecutive transistors, as shown in FIG. 2B, As shown in FIG. 2C, according to an exemplary embodiment of the present disclosure, the sensed voltage Vsense may be sensed at a lower level drain node of a cascode transistor of the replica stack, in this case M2'. Therefore, Vsense takes the value of the drain voltage $V_{D2}$ which is equal to the value of the source voltage $V_{S3}$. A person skilled in the art will appreciate that the teachings according to the present disclosure do not require sensing the voltage Vsense at a specific node of the replica circuit (105'), rather at any node of the replica circuit (105') that can vary/change with respect to a variation/change of a biasing condition of the stacked transistors (M1', M2', . . . , Mn'). In some embodiments, the sensed voltage may represent an average value of a plurality of sensed voltages at a corresponding plurality of nodes of the stacked transistors (M1', M2', . . . , Mn') of the replica circuit (105').

Figure 3A:
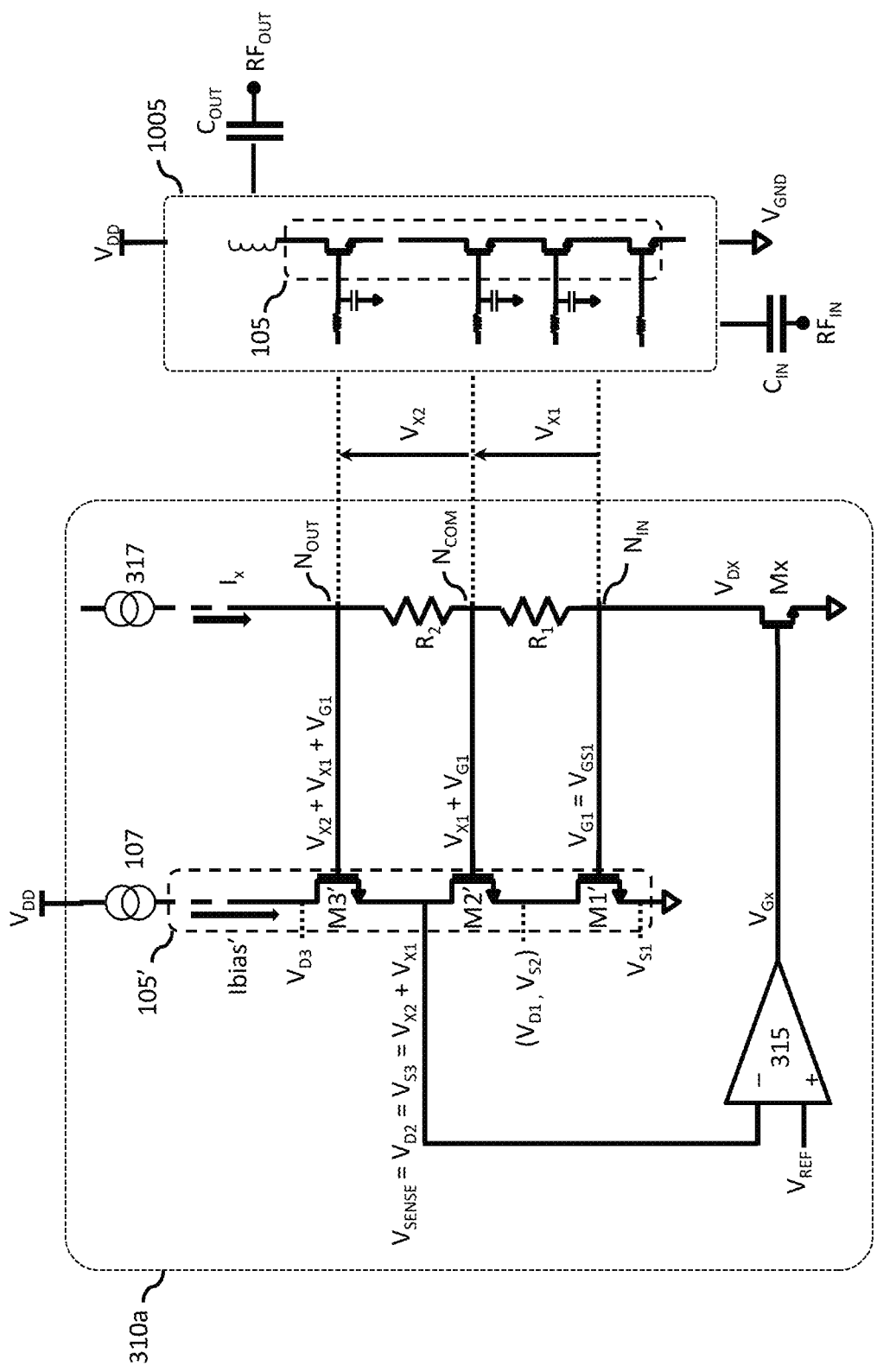
FIG. 3A shows an exemplary embodiment according to the present disclosure of a biasing circuit that implements the closed loop according to FIG. 2C.

FIG. 3A shows an exemplary embodiment according to the present disclosure of a biasing circuit (310a) that implements the closed loop control of the gate biasing voltages ($V_{G1}, V_{G2}, \ldots, V_{Gn}$) according to the configuration shown in FIG. 2C. Accordingly, as can be seen in FIG. 3A, the voltage Vsense that is fed back to the biasing circuit (310a) is sensed at the drain node $V_{D2}$ of the cascode transistor M2' of the replica circuit (105') that is immediately coupled to (in series connection with) the bottom transistor M1' of the replica circuit (105').

With continued reference to FIG. 3A, the biasing circuit (310a) comprises an operational amplifier (315) having a negative terminal (labeled in the figure as "−") that is coupled to the Vsense voltage and a positive terminal (labeled in the figure as "+") that is coupled to a reference voltage Vref. Furthermore, as can be seen in FIG. 3A, the biasing circuit (310a) further comprises a current source (317) that generates a current Ix that flows through a resistive ladder network (R1, R2) and into a drain of a transistor Mx, wherein the resistor ladder network (R1, R2) comprises series connected resistors R1 and R2. As shown in FIG. 3A, i) a first node $N_{OUT}$ of the resistive ladder network (R1, R2) corresponding to a terminal of the resistor R2 at a first (top) end of the ladder network (R1, R2) carries a gate biasing voltage (e.g., $V_{G3}$) for the output (top) cascode transistor (e.g., M3' in the figure), ii) a common node $N_{COM}$ of the resistive ladder network (R1, R2) corresponding to a connection between the two series connected resistors R1 and R2 carries a gate biasing voltage (e.g., $V_{G2}$) for the (middle) cascode transistor (e.g., M2' in the figure), and iii) a last node $N_{IN}$ of the resistive ladder network (R1, R2) corresponding to a terminal of the resistor R1 at a second (bottom) end of the ladder network (R1, R2) carries a gate biasing voltage (e.g., $V_{G1}$) for the input transistor M1'.

With further reference to FIG. 3A, as understood by a person skilled in the art, the current Ix through the resistors R1 and R2 generates respective voltage drops $V_{X1}$ and $V_{X2}$. Accordingly, and as shown in FIG. 3A, gate biasing voltages ($V_{G1}, V_{G2}, V_{G3}$) respectively generated at nodes ($N_{IN}, N_{COM}, N_{OUT}$) are separated by the voltage drops $V_{X1}$ and $V_{X2}$ such that: i) $V_{G2}=V_{G1}+V_{X1}$, and ii) $V_{G3}=V_{G2}+V_{X2}=V_{G1}+V_{X1}+V_{X2}$. In other words, assuming that the current Ix is constant/fixed (i.e., in magnitude), the voltage drops $V_{X1}$ and $V_{X2}$ are also fixed, and therefore the gate biasing voltages ($V_{G2}, V_{G3}$) of the cascode transistors (M2', M3') of the replica circuit (105'), and therefore of cascode transistors (M2 and M3 not labeled in the figure) of the amplifier (1005), vary according to the gate voltage $V_{G1}$ of the input transistor M1'. In other words, any adjustment of the gate voltage $V_{G1}$ by the biasing circuit (310a), based for example on the sensed voltage Vsense, concurrently adjusts the gate voltages $V_{G2}$ and $V_{G3}$ by a same amount.

With continued reference to FIG. 3A, a person skilled in the art will understand that drain-to-source voltages $V_{DS1}=(V_{D1}-V_{S1})$ and $V_{DS2}=(V_{D2}-V_{S2})$ are based on the voltage drops $V_{X1}$ and $V_{X2}$. In particular, for a case wherein the transistors M1' and M2' are of a same type and size, and therefore operate according to a same value of their respective gate-to-source voltages ($V_{GS}$), then: i) $V_{G3}-V_{G2}=(V_{D2}+V_{GS})-(V_{D1}+V_{GS})=V_{D2}-V_{D1}=V_{D2}-V_{S2}=V_{DS2}$, and ii) $V_{G2}-V_{G1}=(V_{D1}+V_{GS})-(V_{S1}+V_{GS})=V_{D1}-V_{S1}=V_{DS1}$. In other words, according to an exemplary embodiment of the present disclosure, the drain-to-source voltages $V_{DS1}$ and $V_{DS2}$ are respectively equal to the voltage drops $V_{X1}$ and $V_{X2}$.

With continued reference to FIG. 3A, the operational amplifier (315) of the biasing circuit (310a) compares the sensed voltage Vsense to the reference voltage Vref and outputs a voltage proportional to the difference voltage ($V_{REF}-V_{SENSE}$) as a gate voltage $V_{GX}$ to the transistor Mx. In turn, the gate voltage $V_{GX}$ causes the drain voltage $V_{DX}$ (common to the node $N_{IN}$) of the transistor Mx to settle to a voltage that corresponds to a biasing condition of the transistor M1' such that its gate voltage $V_{G1}$ sets the desired bias current Ibias' with the desired voltage at $V_{D2}$, while transistor Mx is biased with the fixed bias current Ix. Therefore, it follows that the biasing circuit (310a) generates the gate voltage $V_{G1}$ of the input transistor M1' based on the comparison of the sensed voltage Vsense and the reference voltage Vref. Furthermore, due to the relationship between nodes ($N_{IN}, N_{COM}, N_{OUT}$) and gate biasing voltages ($V_{G1}, V_{G2}, V_{G3}$) described above, it follows that the gate voltages ($V_{G2}, V_{G3}$) are generated by adding fixed offset voltages ($V_{X1}, V_{X1}+V_{X2}$) to the gate voltage $V_{G1}$ via the voltage drops generated by the resistive ladder network (R1, R2) and the current Ix. In other words, as understood by a person skilled in the art, the transistor Mx may be likened to a voltage-controlled resistor through which the current Ix, that supports the distribution of the supply voltage $V_{DD}$ across the transistors of the replica circuit (105'), flows. As resistance of the voltage-controlled resistor varies (i.e., via $V_{GX}$ considered as control voltage), a corresponding voltage drop across the voltage-controlled resistor also varies, which in turn varies $V_{G1}$ and therefore varies the sensed voltage Vsense for a fixed value of Ibias'.

With further reference to FIG. 3A, according to an embodiment of the present disclosure, the current source (317) may be designed to generate the current Ix having a magnitude that is based on the desired voltage drops ($V_{X1}, V_{X2}$) across the resistors (R1, R2) of the resistive ladder network (R1, R2). Since such voltage drops ($V_{X1}, V_{X2}$) are based the desired distribution of the supply voltage $V_{DD}$ across the drain-to-source voltages ($V_{DS1}, V_{DS2}, \ldots, V_{DSn}$), it follows that according to an embodiment of the present disclosure, the magnitude of the current Ix is based on the desired distribution of the supply voltage $V_{DD}$ across the drain-to-source voltages ($V_{DS1}, V_{DS2}, \ldots, V_{DSn}$). In the exemplary non limiting case wherein the transistors M1 and M2 are of a same type and size (therefore a same $V_{GS}$), the magnitude of the current Ix may be chosen to be $V_{X1}/R1=V_{DS1}/R1$ (which could be made equal to $V_{X2}/R2=V_{DS2}/R2$). Furthermore, as described above, the current source (317) may be designed to scale with respect to the supply voltage $V_{DD}$, and therefore providing scaling of $V_{DS1}$ and $V_{DS2}$ with respect to a change in the supply voltage $V_{DD}$. According to a further embodiment of the present disclosure, the current source (317) may be designed using circuit components, including resistors and transistors, that are of a same type as the components (e.g., resistors R1, R2, transistor Mx) used in the generation of the voltages at the nodes ($N_{IN}$, $N_{COM}$, $N_{OUT}$) so to cancel out (e.g. track) any related characteristics of such components based on their respective PVT characteristics. As can be clearly understood by a person skilled in the art, the fixed offset voltages ($V_{X1}$, $V_{X2}$) are based on a flow of a fixed current Ix through respective fixed resistors (R1, R2).

According to an embodiment of the present disclosure, the reference voltage Vref shown in FIG. 3A may be chosen to be substantially equal to an expected nominal voltage value at the sensed node. For example, if the sensed node is at the drain of the cascode transistor M2' of the replica circuit (105') per FIG. 3A, and assuming an equal distribution of the supply voltage $V_{DD}$ across the transistors (M1', M2', M3'), such expected nominal voltage value may be $\frac{2}{3}*V_{DD}$. According to an exemplary embodiment of the present disclosure, Vref can be generated with a resistor ladder network coupled to the supply voltage $V_{DD}$, which therefore by design can track a variation of $V_{DD}$.

Figure 3B:
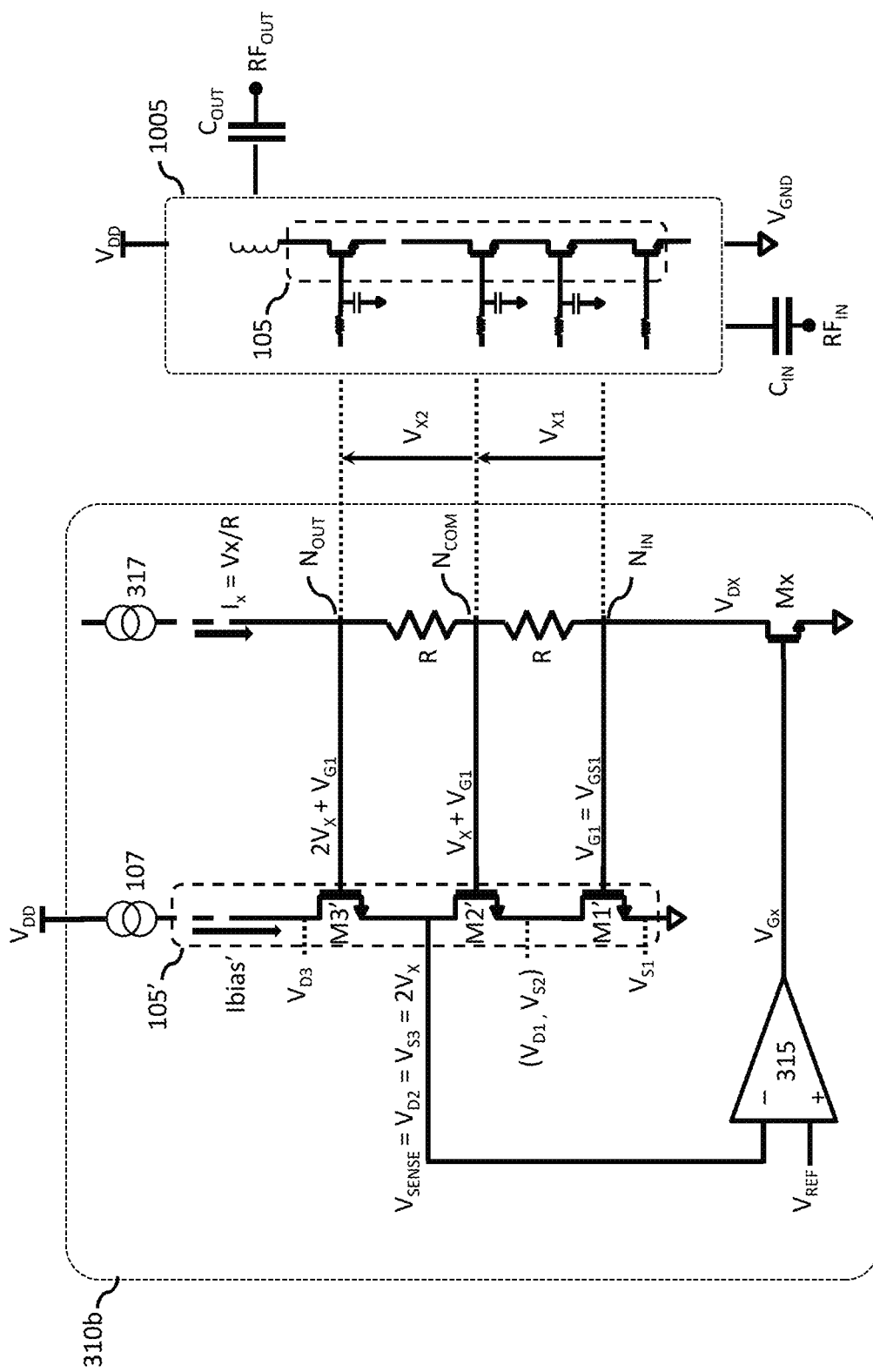
FIG. 3B shows another exemplary embodiment according to the present disclosure of a biasing circuit that implements the closed loop according to FIG. 2C.

FIG. 3B shows another exemplary embodiment according to the present disclosure of a biasing circuit (310b) that implements the closed loop of the gate biasing voltages ($V_{G1}$, $V_{G2}$, ..., $V_{Gn}$) according to the configuration shown in FIG. 2C. A person skilled in the art will understand that the configuration shown in FIG. 3B is the same as the one described above with reference to FIG. 3A with the difference that in the case of FIG. 3B the resistors of the resistive ladder network have a same resistance. Accordingly, as shown in FIG. 3B, each of the resistors R generates in combination with the current Ix a same voltage drop Vx. Assuming the transistors (M1', M2', M3') are of the same type and size (and therefore a same $V_{GS}$), then the configuration of FIG. 3B can provide an equal distribution (e.g., $V_{DD}/3$) of the supply voltage $V_{DD}$ across such transistors. In such case, the magnitude of the current Ix may be chosen to be Ix=$V_X/R=V_{DD}/3R$.

Figure 3C:
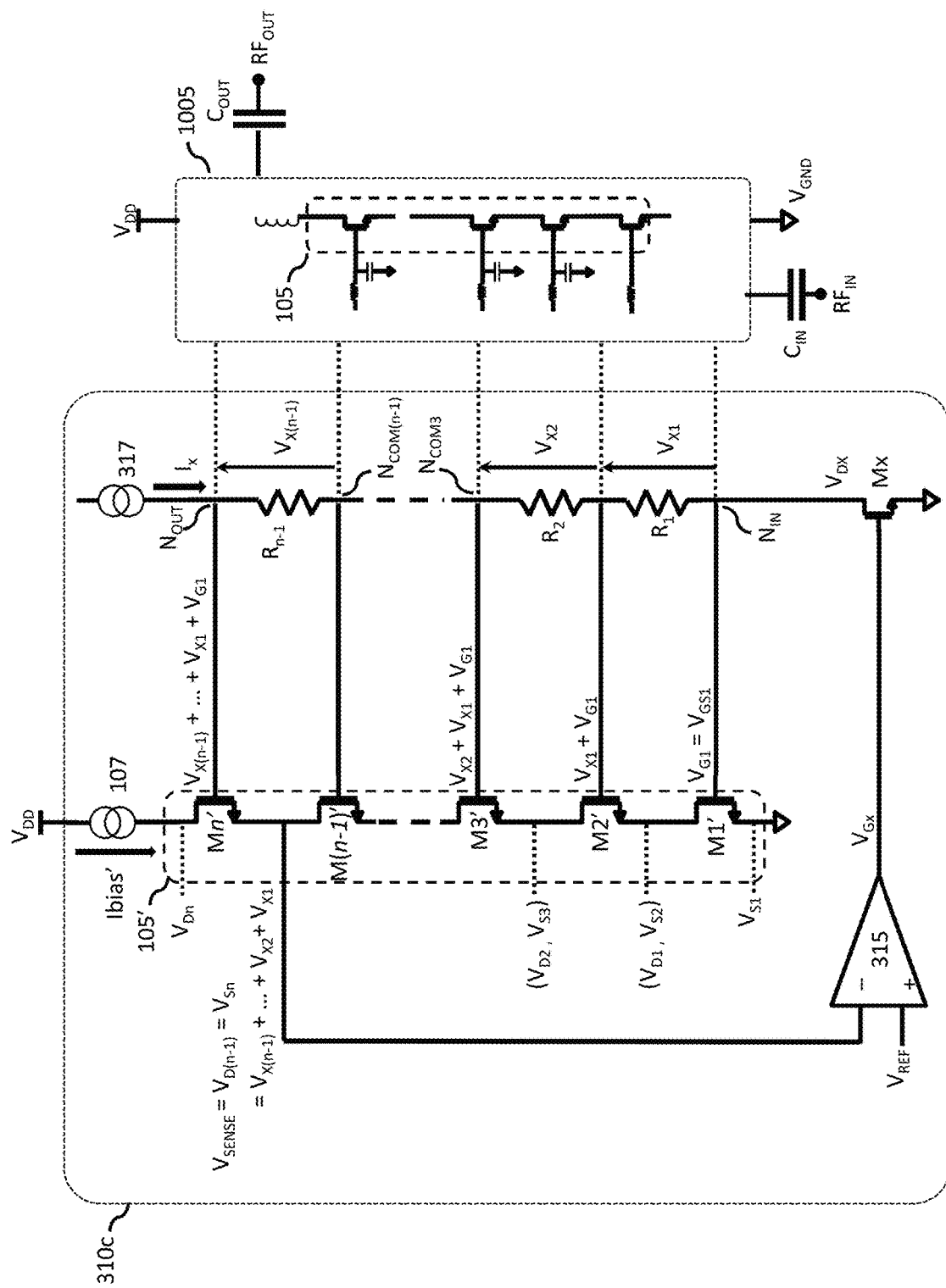
FIG. 3C shows an exemplary embodiment according to the present disclosure of a biasing circuit that implements the closed loop according to FIG. 2B.
Figure 3D:
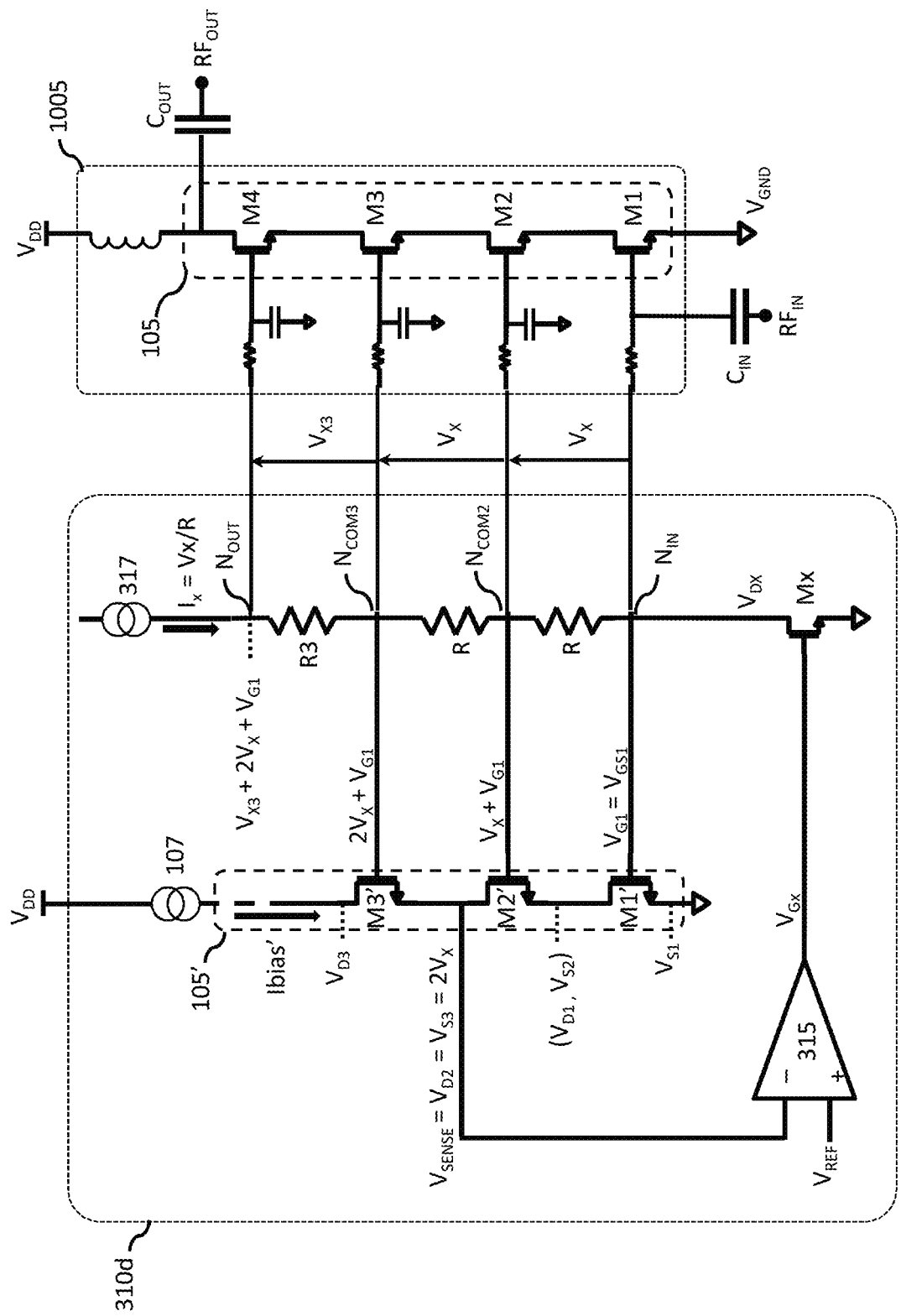
FIG. 3D shows an exemplary embodiment according to the present disclosure of a biasing circuit that implements the closed loop according to FIG. 2B for a case wherein the replica circuit has a smaller stack height compared to a stack height of the stacked transistor amplifier.

FIG. 3C shows an exemplary embodiment according to the present disclosure of a biasing circuit (310c) that implements the closed loop control of the gate biasing voltages ($V_{G1}$, $V_{G2}$, ..., $V_{Gn}$) according to the configuration shown in FIG. 2B. Accordingly, as can be seen in FIG. 3C, the voltage Vsense that is fed back to the biasing circuit (310c) is sensed at a drain node of a cascode transistor of the replica circuit (105') that is not immediately coupled to (in series connection with) the input (bottom) transistor M1'. According to an exemplary non-limiting embodiment shown in FIG. 3C, the sensing voltage Vsense may be sensed at the drain node $V_{D(n-1)}$ of the cascode transistor Mn−1' of the replica circuit (105') that is immediately coupled to (in series connection with) the output transistor Mn' of the replica circuit (105'), or any other transistor Mp' of the replica circuit (105') with n≥p≥1. In general, the sensing voltage Vsense according to the present teachings may be sensed at a drain node of any of the transistors (M1', M2', ..., Mn') of the replica circuit. It should be noted that for a case of the output cascode transistor Mn', drain node of such transistor sees a high impedance output of the current source (107), and therefore a voltage at such drain node can adjust, in view of a corresponding gate-to-source voltage set via the resistive ladder network (R1, ..., Rn−1), to support flow of the current Ibias' through the transistor.

With continued reference to FIG. 3C, generation of the gate biasing voltages ($V_{G1}$, $V_{G2}$, ..., $V_{Gn}$) by the biasing circuit (310c) is substantially same as described above with respect to FIG. 3A. In the exemplary case shown in FIG. 3C, a number n of transistors of the replica circuit (105'), and therefore of the stacked cascode amplifier (105) of the RF amplifier (1005), may be larger than three. In general, teachings according to the present disclosure may apply to any amplifier having a stack height of two or more, such as, for example, 3, 4, 5, 6, 7, 8 or more. A person skilled in the art will understand that a number of series connected resistors (R1, R2, ..., Rn−1) of the resistive ladder network according to the present disclosure may be directly related to the number n of transistors (M1', M2', ..., Mn'). In particular, as shown in FIG. 3C, the resistive ladder network may include (n−1) series connected resistors that form n nodes ($N_{IN}$, $N_{COM2}$, $N_{COM3}$, ..., $N_{COM(n-1)}$, $N_{OUT}$) coupled to respective gate nodes of the transistors (M1', M2', M3', ..., Mn').

FIG. 3D shows an exemplary embodiment according to the present disclosure of a biasing circuit (310d) that implements the closed loop control of the gate biasing voltages (e.g., $V_{G1}$, $V_{G2}$, $V_{G3}$, $V_{G4}$) according to the configuration shown in FIG. 2B for a case wherein the replica circuit (105') has a smaller stack height (e.g., 3) compared to a stack height (e.g., 4) of the stacked transistor amplifier (105). Principle of operation of the closed loop control remains same as described above (e.g., with reference to FIG. 3B), with the difference that the resistive ladder network (R, R, R3) now includes one additional node provided by one additional resistor R3, wherein a voltage drop across the additional resistor, R3, based on a flow of the current Ix through such resistor, provides a fixed offset voltage $V_{X3}$ for biasing of the gate of the transistor M4 of the stacked transistor amplifier (105). It should be noted that any of the configuration above described with reference to FIGS. 3A, 3B and 3C can be modified to include a replica circuit (105') having a stack height that is different from a stack height of the stacked transistor amplifier (105).

According to an embodiment of the present disclosure, effect of larger voltage drops across the current source (107) on the operating points of the top transistors Mn of the stacked transistor amplifier (105) and Mn' of the replica circuit (105') described above may be overcome by making a stack height of the stacked amplifier (105) larger, by for example one transistor as shown in FIG. 3D, so that a drain-to-source voltage across a last transistor (e.g., M4 of FIG. 3D) of the stacked amplifier (105) can be made equal (via corresponding gate biasing voltage provided by the fixed offset voltage $V_{X3}$ through resistor R3) to the voltage drop across the current source (107).

Figure 4:
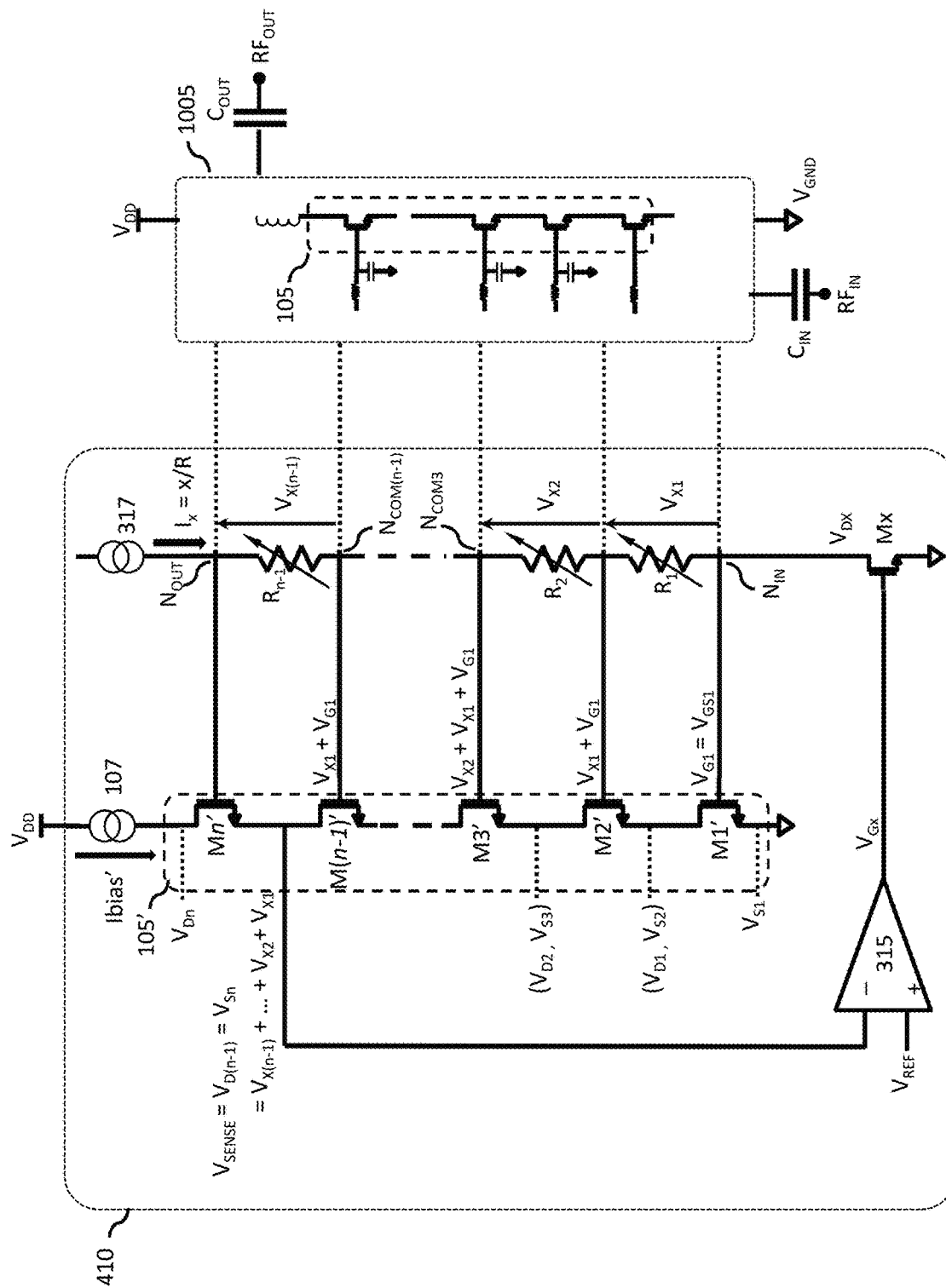
FIG. 4 shows an exemplary embodiment of the biasing circuit of FIG. 3C wherein different supply voltage distributions may be programmatically implemented.

FIG. 4 shows an exemplary embodiment of the biasing circuit of FIG. 3C wherein different distributions of the supply voltage $V_{DD}$ across the transistors (M1', M2', ... Mn') may be programmatically implemented. This may be achieved by including programmable (e.g., variable, adjustable, trimmable, etc.) resistors (R1, R2, ..., Rn−1) as the series connected resistors of the resistive ladder network (R1, R2, ..., Rn−1) shown in FIG. 3C. Accordingly, different values of the programmable resistors (R1, R2, ..., Rn−1) may provide different values of the voltage drops ($V_{X1}$, $V_{X2}$, ..., $V_{X(n-1)}$, and therefore different values of the drain-to-source voltages ($V_{DS1}$, $V_{DS2}$, ..., $V_{DSn}$), and therefore different distributions of the supply voltage $V_{DD}$ across the transistors (M1', M2', ..., Mn') of the replica circuit (105'), and therefore across the transistors (M1, M2, ..., Mn) of the stacked cascode amplifier (105). Such different distributions may be based on different modes of operation of the stacked cascode amplifier (105) of the RF amplifier (1005). According to further exemplary embodiments, the reference voltage Vref may also be programmable and based on a nominal voltage value at the sensing node (Vsense) that changes in view of the different distributions of the supply voltage $V_{DD}$.

With continued reference to FIG. 4, according to an exemplary embodiment of the present disclosure, the magnitude of the current Ix may be fixed and independent of the supply voltage $V_{DD}$. This can allow adjusting of the programmable resistors (R1, R2, ..., Rn−1) in view of a change of the supply voltage $V_{DD}$ to maintain some of the voltage drops ($V_{X1}$, $V_{X2}$, $V_{X(n-1)}$) fixed and let others vary with respect to such change of $V_{DD}$. Accordingly, some of the drain-to-source voltages ($V_{DS1}$, $V_{DS2}$, ..., $V_{DSn}$) may be maintained constant in view of the changing supply voltage $V_{DD}$, and other can be allowed to vary according to the changing supply voltage $V_{DD}$.

Figure 5:
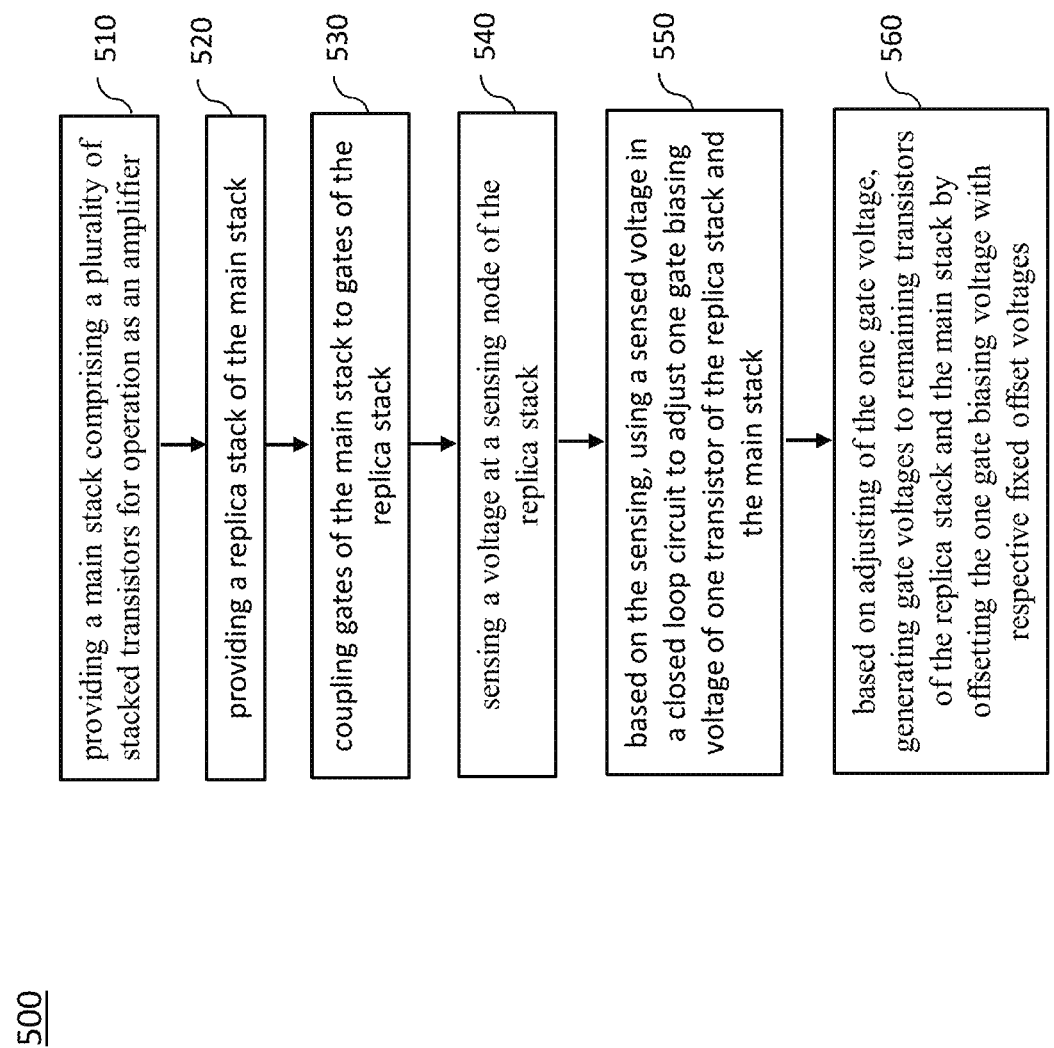
FIG. 5 is a process chart showing steps of a method for biasing a transistor stack according to an embodiment of the present disclosure.

FIG. 5 is a process chart (500) showing various steps of a method for biasing a transistor stack As can be seen in the process chart (500), the method comprises: providing a main stack comprising a plurality of stacked transistors for operation as an amplifier, per step (510); providing a replica stack of the main stack, per step (520), coupling gates of the main stack to gates of the replica stack, per step (530); sensing a voltage at a sensing node of the replica stack, per step (540); based on the sensing, using a sensed voltage in a closed loop circuit to adjust one gate biasing voltage of one transistor of the replica stack and the main stack, per step (550); and based on adjusting of the one gate voltage, generating gate voltages to remaining transistors of the replica stack and the main stack by offsetting the one gate biasing voltage with respective fixed offset voltages, per step (560).

It should be noted that although the above embodiments according to the present disclosure are presented with respect to a stacked transistor amplifier, which is shown to be powered by a (substantially) fixed supply voltage $V_{DD}$, other configurations of such stack transistor amplifier where the supply voltage is variable can also be envisioned. In some exemplary configurations, the supply voltage can be a voltage regulator, or a DC-DC converter. In further exemplary configurations, the supply voltage can vary under control of an external control signal. In some configurations, the control signal can be a function of an envelope signal of the input RF signal, $RF_{in}$, or the output RF signal, $RF_{out}$. Detailed description of such amplifiers operating from a variable supply voltage can be found, for example, in the above referenced Published US Application No. US 2014/0184336 A1, Published US Application No. 2015/0270806 A1, and U.S. Pat. No. 9,219,445, the disclosures of which are incorporated herein by reference in their entirety. A person skilled in the art would also know of configurations where the supply to the amplifier is in the form of a current source instead of the exemplary voltage source (e.g., $V_{DD}$) discussed in the present disclosure. The teachings according to the present disclosure equally apply to such diverse supply configurations. The exemplary case of a fixed supply discussed in the present disclosure should not be considered as limiting what the applicant considers to be the invention. Furthermore, although an exemplary non-limiting case of a single ended RF amplifier configuration is discussed in the above embodiments, the teachings according to the present disclosure equally apply to other amplifier configurations using stacked transistors, such as, for example, differential configurations. Some such configurations are described in, for example, the above referenced Published US Application No. 2014/0184335 A1, Published US Application No. US 2014/0184336 A1, and Published US Application No. 2014/0184337 A1, whose disclosures are incorporated herein by reference in their entirety.

It should be noted that the various embodiments of the biasing circuits according to the present disclosure may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the gate drivers for stacked transistor amplifiers of the disclosure, and are not intended to limit the scope of what the applicant considers to be the invention. Such embodiments may be, for example, used within mobile handsets for current communication systems (e.g. WCDMA, LTE, WiFi, etc.) wherein amplification of signals with frequency content of above 100 MHz and at power levels of above 510 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A circuital arrangement comprising:
a main stack configured to operate as an amplifier, the transistor stack comprising a plurality of stacked transistors comprising an input transistor and one or more cascode transistors comprising a cascode output transistor; the transistor stack configured to operate between a first supply voltage coupled to the output transistor and a reference ground coupled to the input transistor;
a replica stack of the main stack comprising a plurality of stacked transistors, the replica stack configured to operate between the first supply voltage coupled to a cascode output transistor of the replica stack and the reference ground coupled to an input transistor of the replica stack, wherein gates of the plurality of stacked transistors of the replica stack are coupled to respective gates of the plurality of stacked transistors of the main stack; and
a gate biasing circuit coupled to the gates of the plurality of stacked transistors of the replica stack to provide respective gate biasing voltages to the replica stack and the main stack, the gate biasing circuit further coupled to a sensing node of the plurality of stacked transistors of the replica stack,
wherein the gate biasing circuit comprises a feedback loop that is configured to use a sensed voltage at the sensing node as a feedback voltage to adjust one gate biasing voltage provided to a gate of a transistor of the plurality of stacked transistors of the replica stack and the main stack, and
wherein the gate biasing circuit is configured to generate gate biasing voltages for remaining transistors of the plurality of stacked transistors of the replica stack and the main stack by offsetting the one gate biasing voltage with respective fixed offset voltages.

2. The circuital arrangement according to claim 1, wherein the gate biasing circuit is coupled to the gates of the plurality of stacked transistors of the main stack through a respective plurality of series connected resistors.

3. The circuital arrangement according to claim 1, further comprising one or more gate capacitors each connected between: i) a gate of a transistor of the plurality of stacked transistors of the main stack except the input transistor of the main stack, and ii) the reference voltage, wherein the each gate capacitor is configured to allow a gate voltage at said gate to vary along with a radio frequency (RF) voltage at a drain of said transistor.

4. The circuital arrangement according to claim 3, wherein the one or more gate capacitors are configured to substantially equalize an output RF voltage at a drain of the output transistor of the main stack across the plurality of stacked transistors of the main stack.

5. The circuital arrangement according to claim 1, wherein the sensing node is a drain node of a cascode transistor of one or more cascode transistors of the replica stack.

6. The circuital arrangement according to claim 1, wherein the sensing node is a drain node of the input transistor of the replica stack.

7. The circuital arrangement according to claim 1, wherein the one gate biasing voltage is configured to be provided to a gate of the input transistor of the replica stack and the main stack.

8. The circuital arrangement according to claim 7,
wherein the gate biasing circuit further comprises an operational amplifier, and
wherein the operational amplifier is configured to compare the sensed voltage to a reference voltage to adjust the one gate biasing voltage.

9. The circuital arrangement according to claim 8,
wherein the gate biasing circuit further comprises a biasing transistor, and
wherein a gate of the biasing transistor is coupled to an output of the operational amplifier, a drain of the biasing transistor is coupled to the gate of the input transistor of the replica stack, and a source of the biasing transistor is coupled to the reference ground.

10. The circuital arrangement according to claim 9,
wherein the gate biasing circuit further comprises a current source and a resistive ladder network comprising a plurality of series connected resistors, and
wherein the fixed offset voltages are configured to be generated by a fixed current generated by the current source when flowing through the resistive ladder network.

11. The circuital arrangement according to claim 10,
wherein the resistive ladder network comprises a plurality of nodes, including a first node coupled to the gate of the input transistor of the replica stack and the drain of the biasing transistor, a last node coupled to a gate of the output transistor of the replica stack, and middle nodes coupled to respective gates of remaining cascode transistors of the replica stack.

12. The circuital arrangement according to claim 10,
wherein resistors of the plurality of series connected resistors are programmable resistors configured to provide different values of the fixed offset voltages for different modes of operation of the circuital arrangement.

13. The circuital arrangement according to claim 10,
wherein the current source comprises resistor elements, and
wherein the resistor elements and the plurality of series connected resistors of the resistive ladder network have a same process, voltage and temperature (PVT) variation characteristics.

14. The circuital arrangement according to claim 10,
wherein the fixed current generated by the current source is fixed with respect to a fixed supply voltage and scales according to a change in a value of the supply voltage.

15. The circuital arrangement according to claim 8,
wherein the reference voltage is equal to an expected nominal voltage at the sensing node that is based on a distribution of the supply voltage across the plurality of stacked transistors of the replica stack.

16. The circuital arrangement according to claim 14,
wherein the distribution is an even distribution of the supply voltage across the plurality of stacked transistors of the replica stack.

17. The circuital arrangement according to claim 14,
wherein the distribution is an uneven distribution of the supply voltage across the plurality of stacked transistors of the replica stack.

18. The circuital arrangement according to claim 1,
wherein a number of the plurality of stacked transistors of the main stack is larger than a number of the plurality of stack transistors of the replica circuit.

19. The circuital arrangement according to claim 1, further comprising a reference current source coupled between the supply voltage and the drain of the output transistor of the replica stack,
wherein the reference current source provides a replica bias current to the replica stack, and
wherein the gate biasing circuit generates the gate biasing voltages to support flow of the replica bias current through the replica stack, and therefore support flow of a main bias current through the main stack that is based on a ratio of a size of the main stack to a size of the replica stack.

20. The circuital arrangement according to claim 19,
wherein a value of the ratio is in a range from 20:1 to 100:1.

21. The circuital arrangement according to claim 1,
wherein the circuital arrangement is configured to operate in at least a first mode and a second mode, and
wherein biasing of the main stack during operation in the first mode is different from biasing of the main stack during operation in the second mode.

22. The circuital arrangement according to claim 1,
wherein the plurality of stacked transistors of the main stack and the replica stack comprises metal-oxide-semiconductor (MOS) field effect transistors (FETs).

23. The circuital arrangement according to claim 22,
wherein said transistors are fabricated using one of: a) silicon-on-insulator (SOI) technology, b) silicon-on-sapphire (SOS) technology, and c) bulk silicon (Si) technology.

24. The circuital arrangement according to claim 1,
wherein circuital arrangement is monolithically integrated.

25. An electronic module comprising the circuital arrangement of claim 1.

26. A radio frequency (RF) front-end communication system, comprising:
a transmitter section for transmitting an RF signal according to different modes of operation, the transmitter section comprising the circuital arrangement of claim 1.

27. A method for biasing a transistor stack, the method comprising:
providing a main stack comprising a plurality of stacked transistors for operation as an amplifier;
providing a replica stack of the main stack;
coupling gates of the main stack to gates of the replica stack;
sensing a voltage at a sensing node of the replica stack;
based on the sensing, using a sensed voltage in a closed loop circuit to adjust one gate biasing voltage of one transistor of the replica stack and the main stack; and
based on adjusting of the one gate voltage, generating gate voltages to remaining transistors of the replica stack and the main stack by offsetting the one gate biasing voltage with respective fixed offset voltages.

28. The method according to claim 27, wherein the sensing node is a drain node of a cascode transistor of the replica stack.

29. The method according to claim 27, wherein the sensing node is a drain node of an input transistor of the replica stack.

30. A circuital arrangement comprising:
a main stack configured to operate as an amplifier, the transistor stack comprising a plurality of stacked transistors comprising an input transistor and one or more cascode transistors comprising a cascode output transistor; the transistor stack configured to operate between a first supply voltage coupled to the output transistor and a reference ground coupled to the input transistor;
a replica stack of the main stack comprising a plurality of stacked transistors, the replica stack configured to operate between the first supply voltage coupled to a cascode output transistor of the replica stack and the reference ground coupled to an input transistor of the replica stack, wherein gates of the plurality of stacked transistors of the replica stack are coupled to respective gates of the plurality of stacked transistors of the main stack; and
a gate biasing circuit coupled to the gates of the plurality of stacked transistors of the replica stack to provide respective gate biasing voltages to each of the input transistor and the one or more cascode transistors of the replica stack and the main stack, the gate biasing circuit further coupled to a sensing node of the plurality of stacked transistors of the replica stack, wherein the gate biasing circuit comprises a feedback loop that is configured to use a sensed voltage at the sensing node as a feedback voltage to adjust one gate biasing voltage provided to a gate of a transistor of the plurality of stacked transistors of the replica stack and the main stack, and wherein the gate biasing circuit is configured to generate gate biasing voltages for remaining transistors of the plurality of stacked transistors of the replica stack and the main stack by offsetting the one gate biasing voltage with respective fixed offset voltages.

* * * * *